United States Patent
Park et al.

(10) Patent No.: US 7,183,571 B2
(45) Date of Patent: Feb. 27, 2007

(54) POLYCRYSTALLINE SILICON THIN FILM, FABRICATION METHOD THEREOF, AND THIN FILM TRANSISTOR WITHOUT DIRECTIONAL DEPENDENCY ON ACTIVE CHANNELS FABRICATED USING THE SAME

(75) Inventors: Ji Yong Park, Suwon (KR); Hye Hyang Park, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/694,030

(22) Filed: Oct. 28, 2003

(65) Prior Publication Data
US 2004/0173800 A1 Sep. 9, 2004

(30) Foreign Application Priority Data
Mar. 5, 2003 (KR) ................. 10-2003-0013829

(51) Int. Cl.
*H01L 29/04* (2006.01)
(52) U.S. Cl. .............. 257/64; 257/E29.003; 257/75; 257/70
(58) Field of Classification Search ............ 257/75, 257/64, 70, E29.003, E29.105; 438/150, 438/166; 117/8, 904
See application file for complete search history.

(56) References Cited

U.S. PATENT DOCUMENTS

| 6,177,391 | B1  |   | 1/2001  | Zafar |        |
|-----------|-----|---|---------|-------|--------|
| 6,322,625 | B2  |   | 11/2001 | Im    |        |
| 6,451,638 | B1  | * | 9/2002  | Zhang et al. | 438/166 |
| 6,528,820 | B1  | * | 3/2003  | Yamazaki et al. | 257/66 |
| 6,726,768 | B2  |   | 4/2004  | Yoon  |        |
| 6,755,909 | B2  | * | 6/2004  | Jung  | 117/4  |
| 2002/0168577 | A1 |  | 11/2002 | Yoon  |        |
| 2003/0071312 | A1 | * | 4/2003  | Oana et al. | 257/368 |
| 2003/0197666 | A1 | * | 10/2003 | Akimoto et al. | 345/82 |

FOREIGN PATENT DOCUMENTS

WO        97/45827        12/1997

OTHER PUBLICATIONS

Chinese Office Action issued on Feb. 10, 2006, in Chinese Patent Application No. 2004100036565 (in Chinese with English translation).

English Abstract of CN1389600A cited in Chinese Office Action issued on Feb. 10, 2006, in Chinese Patent Application No. 2004100036565.

* cited by examiner

*Primary Examiner*—Kenneth Parker
*Assistant Examiner*—Matthew C. Landau
(74) *Attorney, Agent, or Firm*—Stein, McEwen & Bui, LLP (57) ABSTRACT

A polycrystalline silicon thin film to be used in display devices, the thin film having adjacent primary grain boundaries that are not parallel to each other, wherein an area surrounded by the primary grain boundaries is larger than 1 μm², a fabrication method of the polycrystalline silicon thin film, and a thin film transistor fabricated using the method.

16 Claims, 9 Drawing Sheets

PRIMARY GRAIN
BOUNDARY

TRANSPARENT REGIONS    OPAQUE REGIONS

FIG. 6

PRIMARY GRAIN BOUNDARY

FIG. 7

TRANSPARENT REGIONS    OPAQUE REGIONS

FIG. 8

PRIMARY GRAIN BOUNDARY

FIG. 9

TRANSPARENT REGIONS    OPAQUE REGIONS

FIG. 10

PRIMARY GRAIN BOUNDARY

POLYCRYSTALLINE SILICON THIN FILM, FABRICATION METHOD THEREOF, AND THIN FILM TRANSISTOR WITHOUT DIRECTIONAL DEPENDENCY ON ACTIVE CHANNELS FABRICATED USING THE SAME

CROSS-REFERENCE TO RELATED APPLICATIONS

This application claims the benefit of Korean Patent Application No. 2003-13829, filed on Mar. 5, 2003, under 35 U.S.C. § 119, the entirety of which is hereby incorporated by reference.

BACKGROUND OF THE INVENTION

1. Field of the Invention

The present invention relates to a polycrystalline silicon thin film for display devices, a fabrication method thereof, and a thin film transistor fabricated using the same. The present invention relates more particularly to a polycrystalline silicon thin film fabricated by controlling the shape of the silicon grains, a fabrication method of the thin film, and a thin film transistor fabricated using the polycrystalline silicon thin film.

2. Description of the Related Art

Ordinarily, the sequential lateral solidification (SLS) method is used for crystallizing the silicon grains by overlappingly irradiating a laser beam onto an amorphous silicon layer two or more times so that silicon grains are laterally grown. Polycrystalline silicon grains manufactured using the SLS method are characterized in that they are formed in a cylindrical shape lengthy from end to end, and grain boundaries are generated between adjacent grains due to the limited size of the grains.

It is reported that polycrystalline or single crystalline grains are capable of forming large silicon grains on a substrate using the SLS crystallization technology, and a thin film transistor (TFT) fabricated using the large silicon grains is capable of obtaining characteristics similar to characteristics of a TFT fabricated using single crystalline silicon.

FIG. 1A, FIG. 1B, FIG. 1C, and FIG. 1D represent an ordinary SLS crystallization method.

Figure 1A:
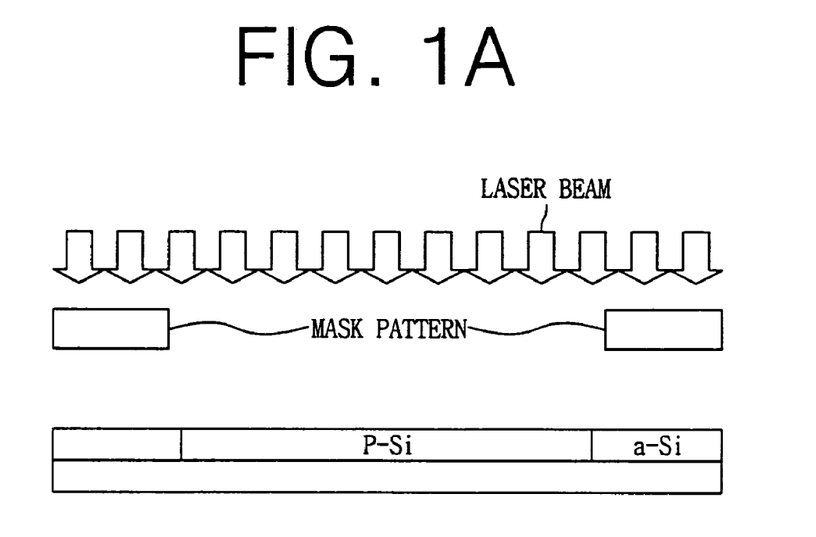
FIGS. 1A, 1B, 1C, and 1D are drawings schematically illustrating a conventional SLS crystallization method.

In the SLS crystallization method, amorphous silicon is melted in the laser beam transmission region if a laser beam is irradiated onto an amorphous silicon thin film layer through a mask having a laser beam transmission region and a laser beam non-transmission region as shown in FIG. 1A.

Crystallization occurs at an amorphous silicon/molten silicon interface when cooling begins after irradiation of the laser beam is completed, wherein a temperature gradient is formed in such a way that the temperature of the silicon is gradually reduced from the amorphous silicon/molten silicon interface toward the central part of the molten silicon layer, the molten silicon solidifying, and crystallizing, as the heat dissipates.

Figure 1B:
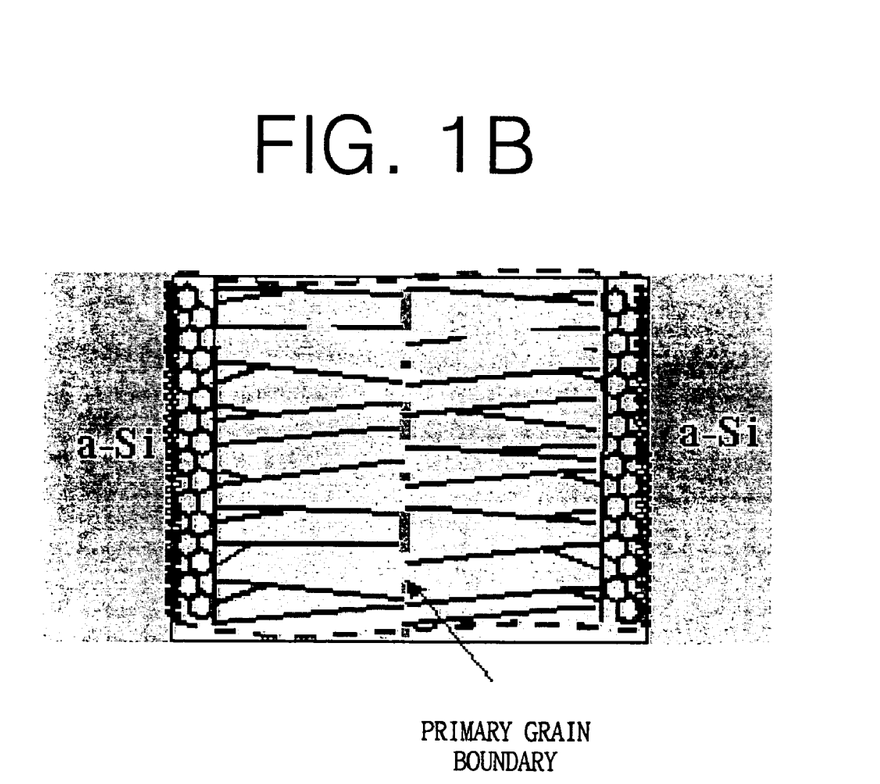

Therefore, referring to FIG. 1B, a polycrystalline silicon thin film layer, having grains that are formed in a long cylindrical shape, is formed. Polycrystalline silicon grains are laterally grown until the molten silicon layer is completely solidified as heat flux flows from the mask interface to the central part of the molten silicon layer.

Figure 1C:
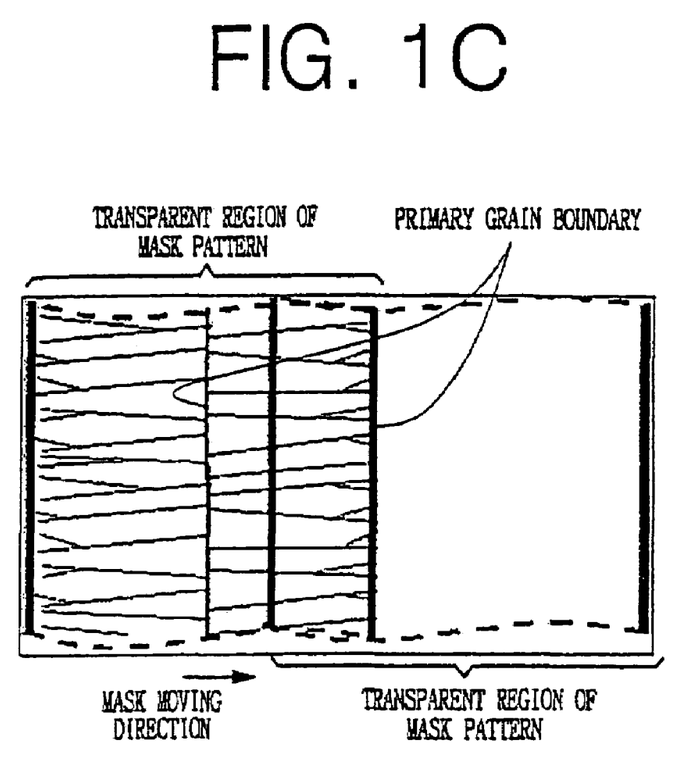
Figure 1D:
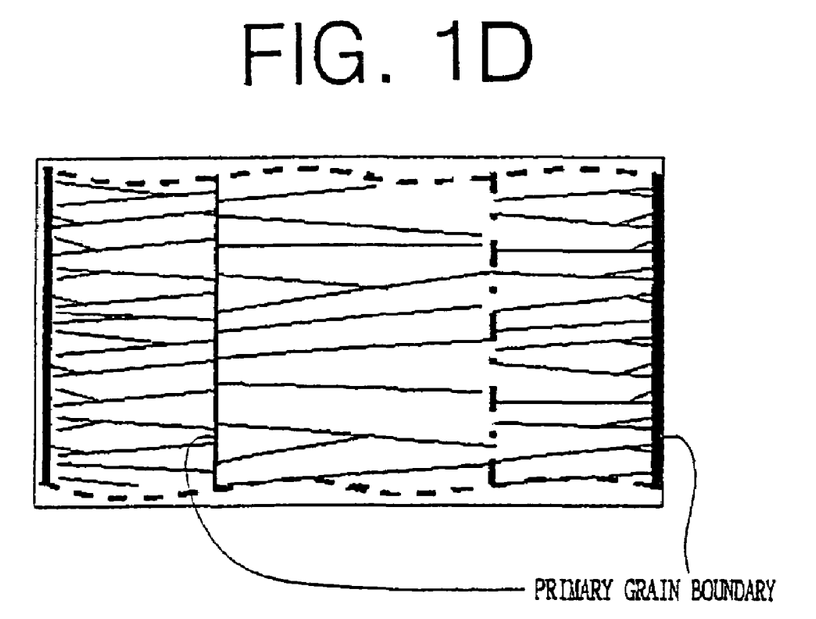

As illustrated in FIG. 1C and FIG. 1D, by moving the laser beam transmission region of the mask so that it exposes more of the amorphous silicon and a portion of the crystalline silicon, and irradiating this exposed area with the laser beam, the length of the grains is increased, with silicon atoms being adhered to already formed polycrystalline silicon grains that are not melted, due to being covered by the mask, as the partially melted amorphous silicon thin film and crystallized silicon layer are being cooled thereafter.

Therefore, TFT characteristics close to single crystalline silicon can be obtained, since a barrier effect of a grain boundary to a charge carrier direction is minimized in the case that an active channel direction is parallel to the direction of the grains grown by the SLS method when fabricating the TFT. TFT characteristics are greatly deteriorated in the case that the active channel direction is perpendicular to a grain growing direction, because a plurality of grain boundaries act as a trap of the charge carriers.

The mounting possibility of a circuit is restricted, because the TFT characteristics are greatly changed depending on the active channel direction in the case of the TFT being fabricated by an existing SLS method.

On the other hand, it is disclosed in PCT international patent No. WO97/45827 and U.S. Pat. No. 6,322,625 that amorphous silicon on the whole substrate is converted into polycrystalline silicon, or only a selected region on the substrate is crystallized by SLS technology after depositing the amorphous silicon on a substrate.

Furthermore, when fabricating TFTs for a liquid crystal display (LCD) device, comprising a driver and pixel array, by forming large silicon grains using the SLS crystallization technology, characteristics of TFTs similar to characteristics of TFTs fabricated using single crystalline silicon can be obtained because the barrier effect of grain boundaries for a charge carrier direction is minimized in the case that an active channel direction is parallel to the direction of the grains grown by the SLS crystallization method, as described in U.S. Pat. No. 6,177,391. But a plurality of grain boundaries which act as traps of the charge carrier exist in this method, and also TFT characteristics are greatly deteriorated in the case that the active channel direction is perpendicular to the growing direction of the grains in patents like this.

Actually, there are cases in which TFTs inside a driving circuit are generally perpendicular to the TFT in a pixel cell region when fabricating an active matrix display, wherein the uniformity of the device can be improved by fabricating the active matrix display in such a way that the direction of the active channel regions is inclined to the crystal growing direction at an angle of 30 to 60 in order to improve the uniformity of characteristics between TFTs, while the characteristics of each TFT are not greatly deteriorated.

However, it is likely that fatal grain boundaries are included in the active channel regions, since this method also uses grains having a limited size formed by the SLS crystallization technology. Therefore, there is a problem in that unpredictable non-uniformity causes a difference of characteristics between TFTs in this method.

SUMMARY OF THE INVENTION

Therefore, in order to solve the foregoing and/or other problems of the related art, it is an aspect of the present invention to provide a method for controlling the shape of polycrystalline silicon fabricated in the case of fabricating a polycrystalline silicon thin film by the SLS crystallization method, and a polycrystalline silicon thin film fabricated using the method.

Furthermore, it is another aspect of the present invention to provide a TFT having superior characteristics without the TFT characteristics depending on the active channel direction by using the above fabricated polycrystalline silicon thin film.

Additional aspects and advantages of the invention will be set forth in part in the description which follows and, in part, will be obvious from the description, or may be learned by practice of the invention.

In order to achieve the foregoing and/or other aspects, the present invention provides a polycrystalline silicon thin film to be used in display devices, the thin film comprising adjacent primary grain boundaries that are not parallel to each other, wherein an area surrounded by the primary grain boundaries is larger than 1 µm².

Furthermore, the present invention provide a thin film transistor fabricated using the polycrystalline silicon thin film.

Furthermore, the present invention provides a method of fabricating a polycrystalline silicon thin film to be used in display devices, the method comprising crystallizaing amorphous silicon by a laser using a mask comprising a laser transmission region in which line shaped laser transmission patterns and laser non-transmission patterns are mixed.

Furthermore, the present invention provides a fabrication method of a polycrystalline silicon thin film to be used in display devices, the method comprising crystallizing amorphous silicon by a laser using a mask in which laser transmission patterns are mixed with laser non-transmission patterns, wherein the laser non-transmission patterns are circular or dot shaped opaque mask patterns.

Furthermore, the present invention provides a polycrystalline silicon thin film to be used in an electroluminescent display device fabricated by the foregoing methods.

BRIEF DESCRIPTION OF THE DRAWINGS

These and/or other aspects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

Figure 2:
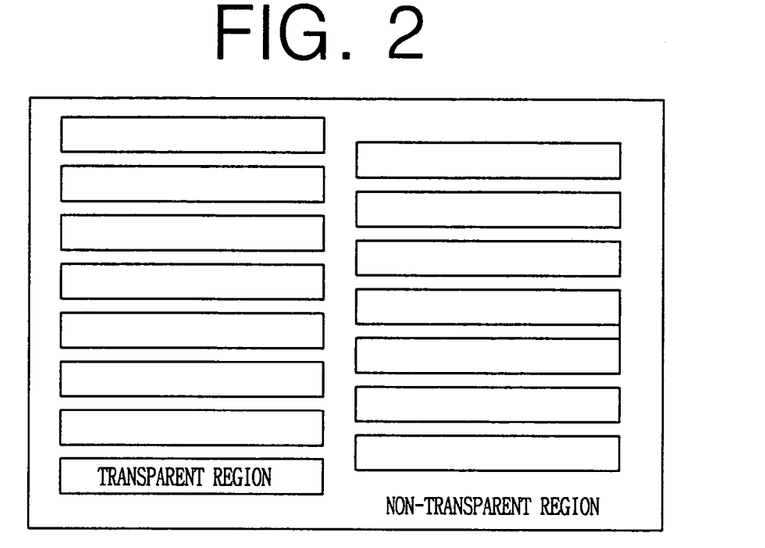
FIG. 2 is a plan figure schematically illustrating the structure of a mask used in a polycrystalline silicon thin film fabrication method according to an embodiment of the present invention.
Figure 3:
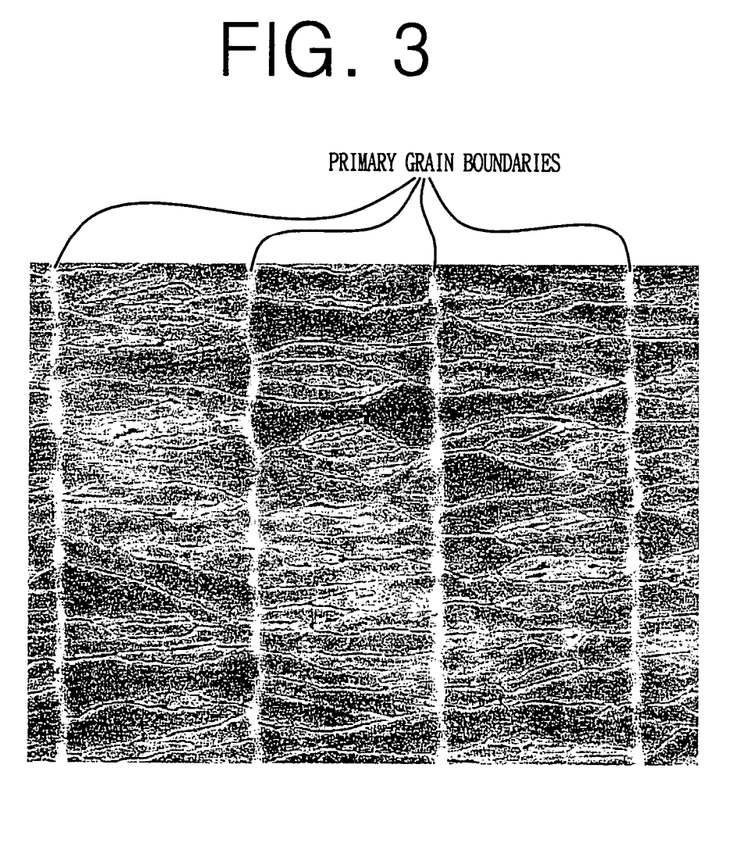
FIG. 3 is a plan figure of the polycrystalline silicon thin film fabricated using the mask of FIG. 2.

FIG. 2 is a plan figure schematically illustrating a structure of a mask used in a polycrystalline silicon thin film fabrication method according to an embodiment of the present invention, and FIG. 3 is a plan figure of the polycrystalline silicon thin film fabricated using the mask.

As shown in FIG. 2, polycrystalline silicon grains are formed in a shape which is long in a direction since heat flux is formed from the edge to the central part of laser beam transmission patterns in the case that a laser beam is irradiated in such a way that the laser beam passes through a mask having line shaped patterns which are formed in a long rectangular shape in a direction.

In the case of using a mask pattern illustrated in FIG. 2, silicon grains that are grown oppositely to each other from the interface of a laser transmission part meet each other at a central part of patterns as shown in FIG. 3 so that grain boundaries having a high protrusion part are formed, resulting in the formation of cylindrical grains in which primary grain boundaries are arranged in a stripe shape.

Figure 4:
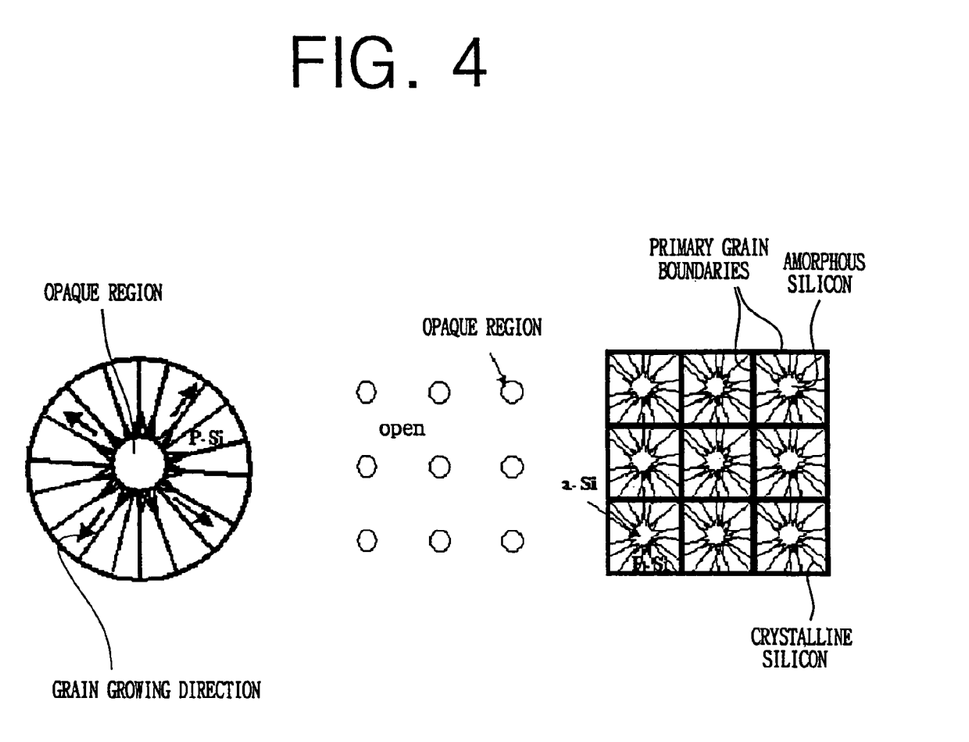
FIG. 4 is a plan figure schematically illustrating the structure of a mask used in a polycrystalline silicon thin film fabrication method according to another embodiment of the present invention.

FIG. 4 is a plan figure schematically illustrating a structure of a mask used in a polycrystalline silicon thin film fabrication method according to another embodiment of the present invention.

In FIG. 4, polycrystalline silicon grains are grown in every direction since heat flux is generated from the central part of dot patterns, through which a laser beam is not capable of transmitting, to an external angle direction in the case of using a mask in which a laser beam non-transmission part has circular or dot shaped patterns.

In the case that the dot patterns are arranged in a rectangular shape, polycrystalline silicon grains grown from the edge of the respective dot patterns collide with each other so that primary grain boundaries formed accordingly have a rectangular shape if a gap between the patterns is shorter than lateral growing distance of the grains. Therefore, a polycrystalline silicon thin film having various shaped microstructures can be fabricated by controlling the shape and arrangement of the mask patterns.

It may be preferable that adjacent primary grain boundaries of the polycrystalline silicon grains are not parallel to each other, and the area surrounded by the primary grain boundaries is larger than 1 $\mu m^2$.

Figure 5:
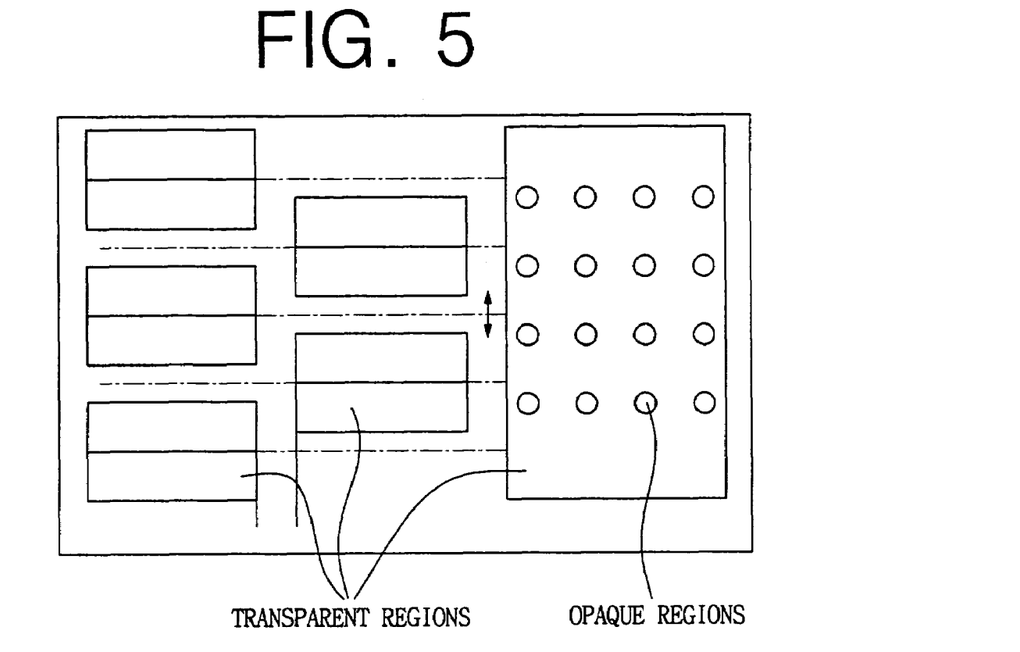
FIG. 5 shows a mask pattern according to still another embodiment of the present invention, wherein a laser transmission region is formed in line pattern groups that are formed in a long rectangular shape in a direction, the line pattern groups are alternately arranged with being parallel to each other by being spaced apart from each other at a certain distance, and a laser non-transmission dot shaped mask pattern is arranged in a rectangular shape.

FIG. 5 shows a mask pattern according to still another embodiment of the present invention, wherein a laser transmission region is formed in line pattern groups that are formed in a long rectangular shape in a direction, the line pattern groups are alternately arranged with being parallel to each other by being spaced apart from each other at a certain distance, and a laser non-transmission dot shaped mask pattern is arranged in a rectangular shape.

Figure 6:
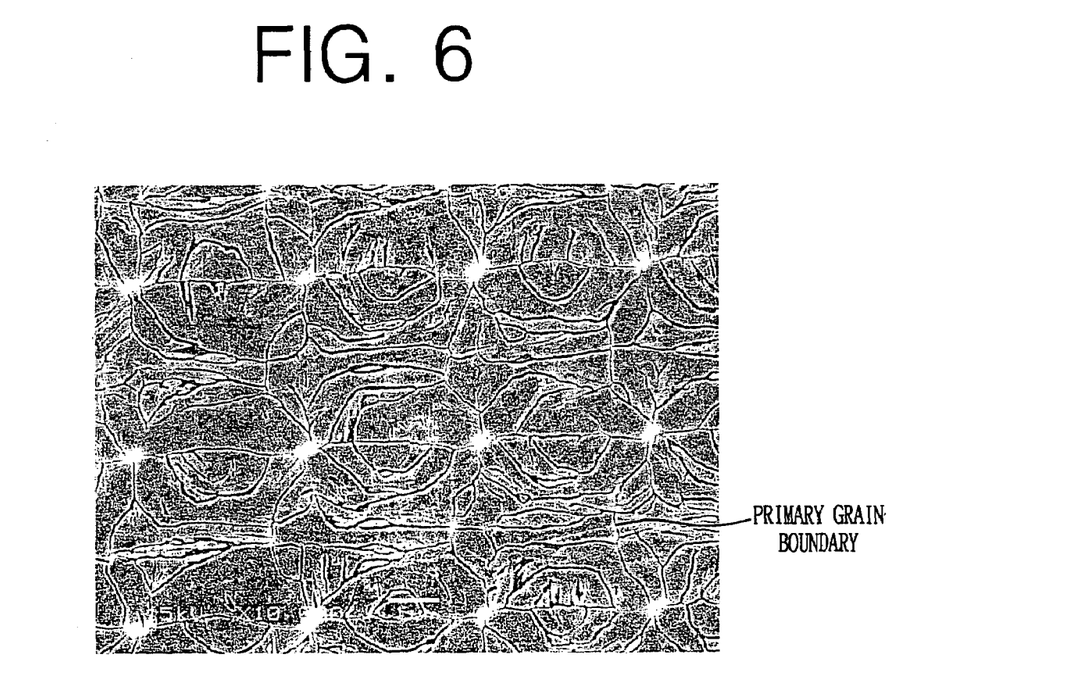
FIG. 6 shows grains of the polycrystalline silicon thin film fabricated using the mask of FIG. 5.

FIG. 6 shows the grains of the polycrystalline silicon thin film fabricated using the mask of FIG. 5, wherein the primary grain boundaries of a polycrystalline silicon thin film are arranged in a rectangular shape in the case of crystallizing amorphous silicon using the mask pattern of FIG. 5. It may also be preferable in this embodiment of the present invention that adjacent primary grain boundaries of the polycrystalline silicon grains are not parallel to each other, and the area surrounded by the primary grain boundaries is larger than 1 $\mu m^2$.

Figure 7:
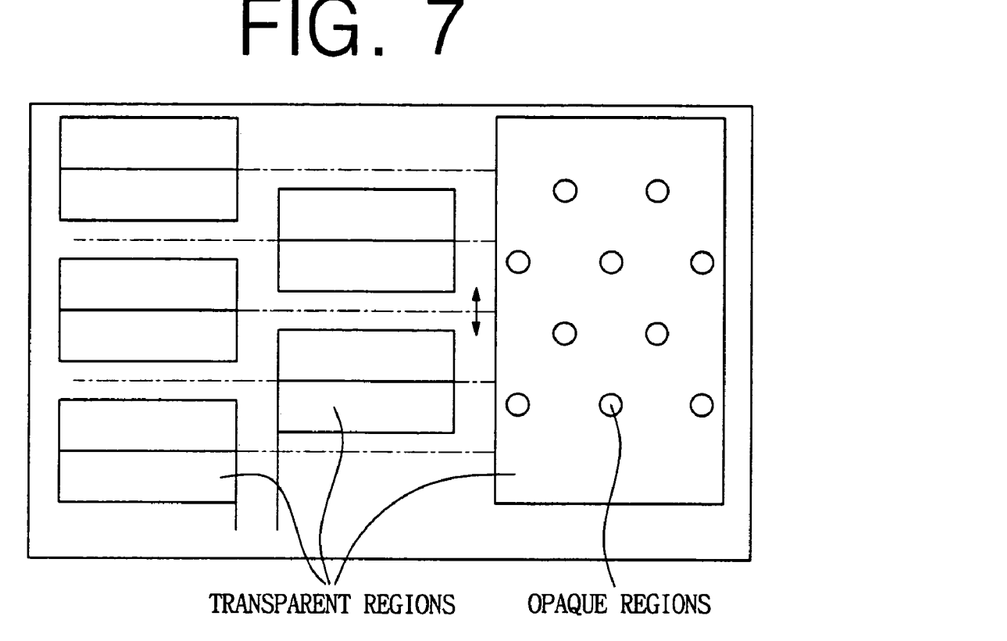
FIG. 7 illustrates a mask pattern according to yet another embodiment of the present invention, wherein the line pattern groups are formed in a long rectangular shape in a laser transmission direction so that the line pattern groups are alternately arranged with being parallel to each other by being spaced apart from each other at a certain distance, and a laser non-transmission dot shaped pattern is arranged in a triangle shape.

FIG. 7 illustrates a mask pattern according to yet another embodiment of the present invention, wherein the line pattern groups are formed in a long rectangular shape in a laser transmission direction so that the line pattern groups are alternately arranged and are parallel to each other by being spaced apart from each other at a certain distance, and a laser non-transmission dot shaped pattern is arranged in a triangle shape.

Figure 8:
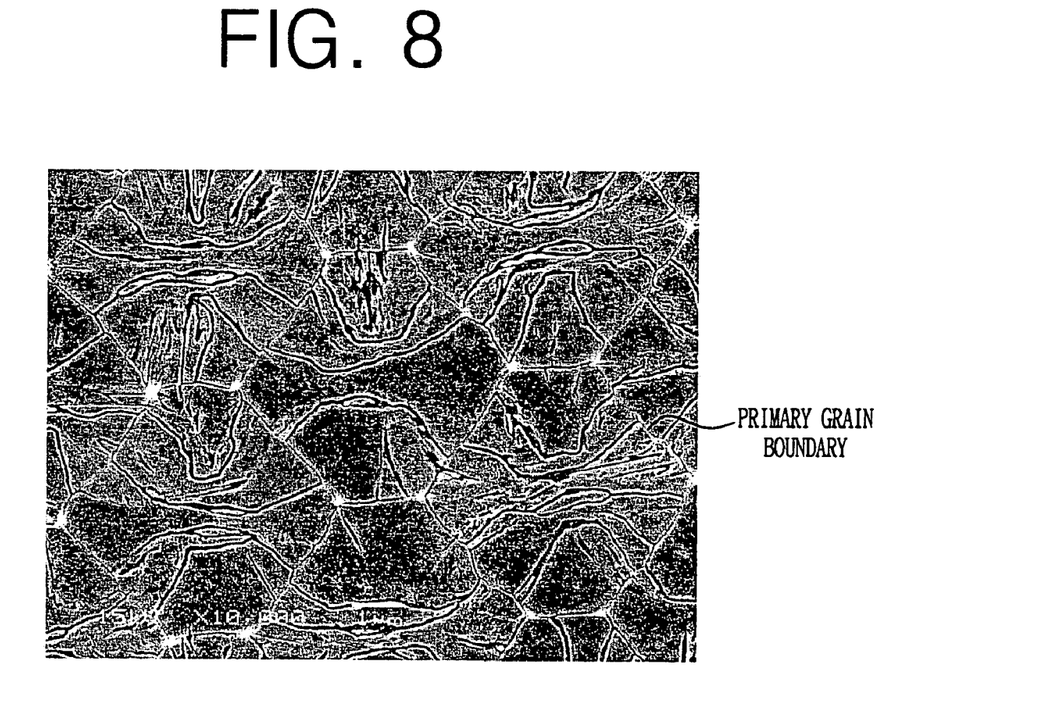
FIG. 8 shows grains of the polycrystalline silicon thin film fabricated using the mask of FIG. 7.

FIG. 8 shows grains of the polycrystalline silicon thin film fabricated using the mask of FIG. 7, wherein the primary grain boundaries of a polycrystalline silicon thin film are arranged in a hexagonal shape in the case of crystallizing amorphous silicon using the mask pattern of FIG. 7. It may also be preferable in this embodiment of the present invention that adjacent primary grain boundaries of the polycrystalline silicon grains are not parallel to each other, and the area surrounded by the primary grain boundaries is larger than 1 $\mu m^2$.

Figure 9:
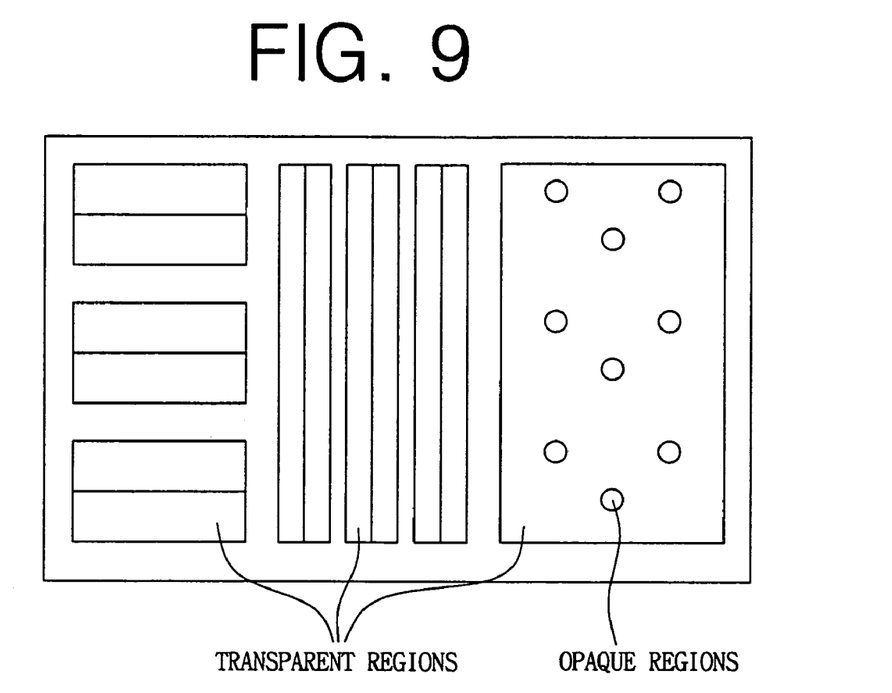
FIG. 9 illustrates a mask pattern according to yet another embodiment of the present invention, wherein the line pattern groups are formed in a long rectangular shape in a laser transmission direction so that the line pattern groups are arranged perpendicularly to each other, and a laser non-transmission dot shaped pattern is arranged in an irregular rectangular shape.

FIG. 9 illustrates a mask pattern according to yet another embodiment of the present invention, wherein the line pattern groups are formed in a long rectangular shape in a laser transmission direction so that the line pattern groups are arranged perpendicularly to each other, and a laser non-transmission dot shaped pattern is arranged in an irregular rectangular shape.

Figure 10:
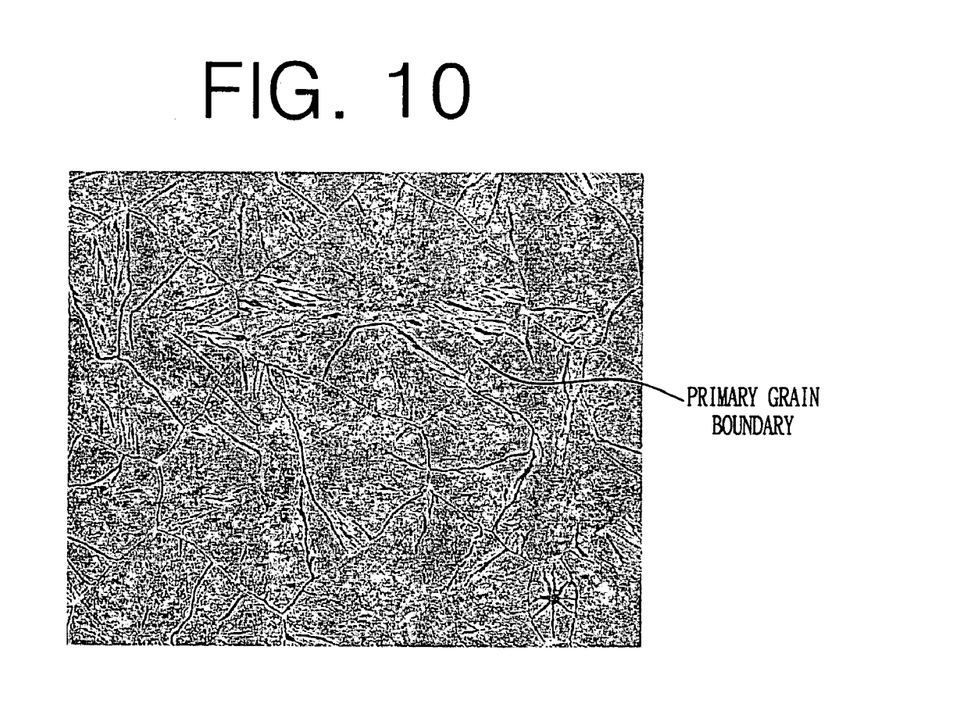
FIG. 10 shows grains of the polycrystalline silicon thin film fabricated using the mask of FIG. 9.

FIG. 10 shows grains of the polycrystalline silicon thin film fabricated using the mask of FIG. 9, wherein the primary grain boundaries of a polycrystalline silicon thin film are arranged in an irregular closed polygonal shape in the case of crystallizing amorphous silicon using the mask pattern of FIG. 9. It may also be preferable in this embodiment of the present invention that adjacent primary grain boundaries of the polycrystalline silicon grains are not parallel to each other, and area surrounded by the primary grain boundaries is larger than 1 $\mu m^2$.

The primary grain boundaries of the polycrystalline silicon grains fabricated in these embodiments of the present invention are symmetrical to each other centering around a certain axis passing through the primary grain boundaries, and the primary grain boundaries preferably form a hyperbola centering around a radial shape or the certain axis.

It may be preferable that a thin film transistor fabricated using a polycrystalline silicon thin film of the present invention is used in an organic electroluminescent display device.

As is readily apparent from FIGS. 1A–1D and 2–10 and the description thereof in the specification, a primary grain boundary is a boundary where polycrystalline silicon grains grown in different directions meet. For example, FIGS. 1A and 1B show an example of a primary grain boundary where polycrystalline silicon grains grown from left to right meet polycrystalline silicon grains grown from right to left. Also, FIG. 4 shows an example of primary grain boundaries where polycrystalline silicon grains grown outward from an amorphous region on one side of a primary grain boundary meet silicon grains grown outward from an amorphous region on the other side of the primary grain boundary.

Figure 11:
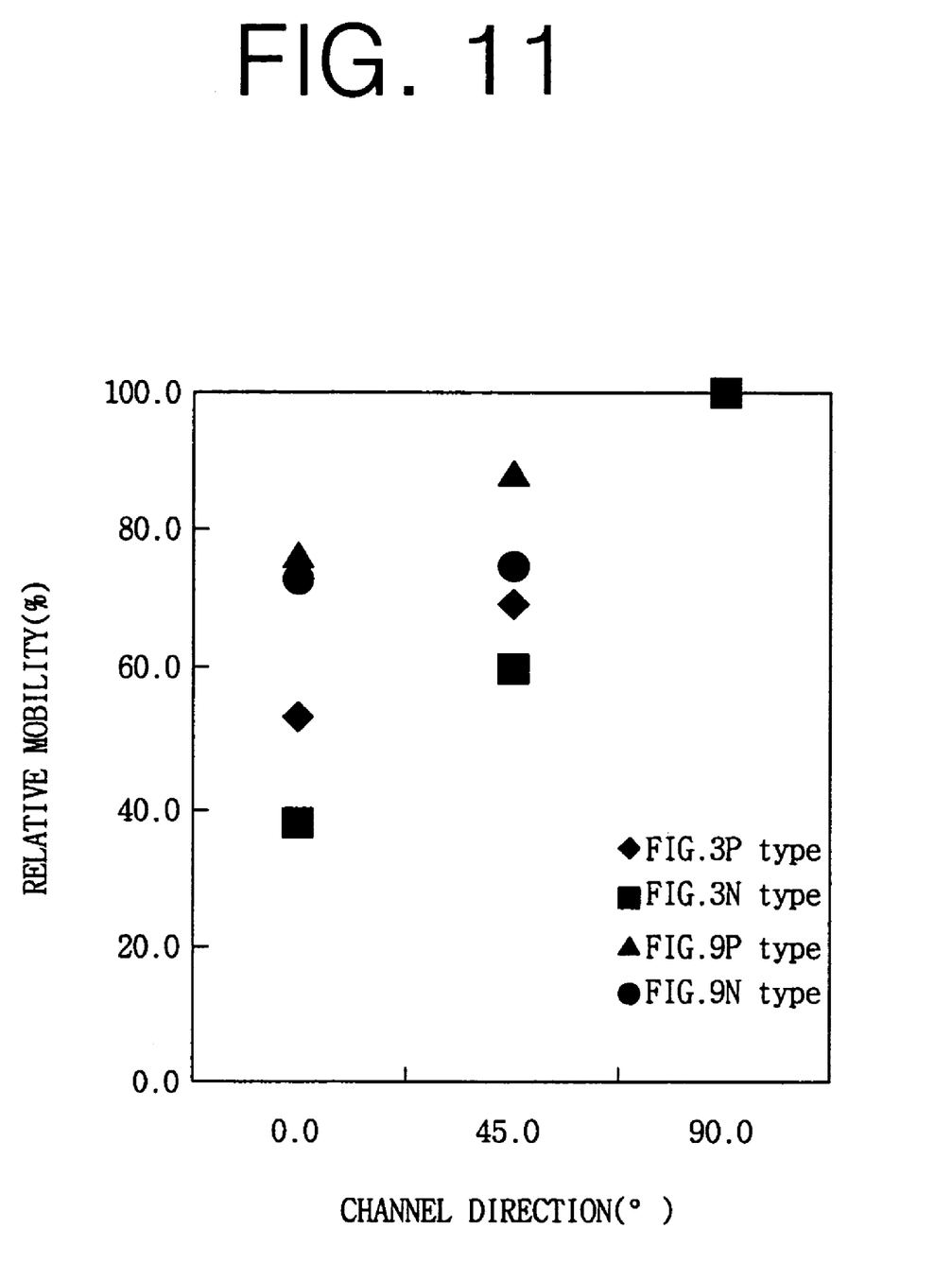
FIG. 11 is a graph illustrating dependency on channel direction for an electric field mobility of TFTs fabricated using the polycrystalline silicon thin film fabricated according to embodiments of the present invention.

FIG. 11 is a graph illustrating dependency on channel direction for electric field mobility of a TFT fabricated using the polycrystalline silicon thin film fabricated using a mask pattern according to embodiments of the present invention illustrated in FIG. 3 and FIG. 9.

Figure 12:
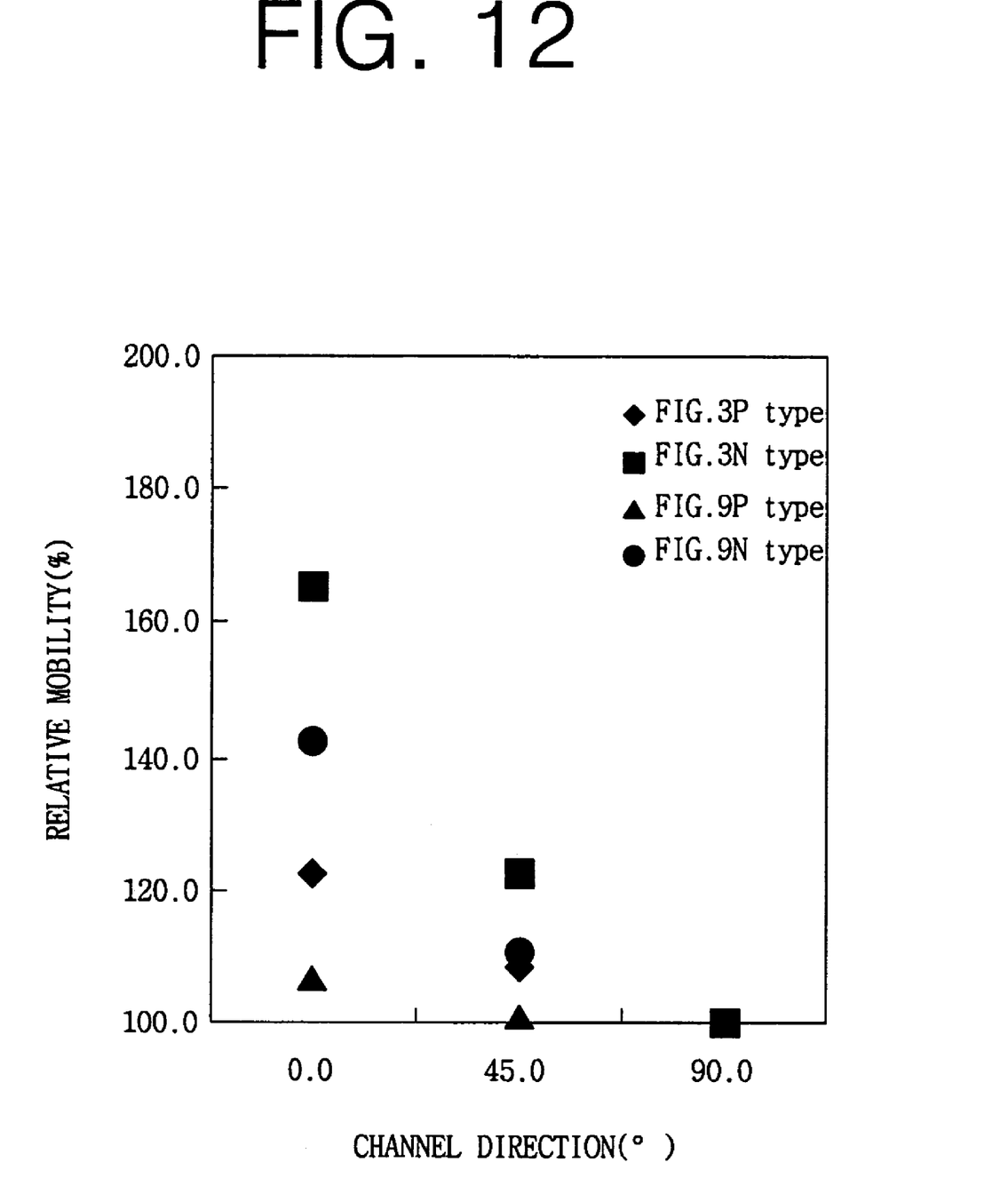
FIG. 12 is a graph showing dependency on channel direction for threshold voltage of TFTs fabricated using the polycrystalline silicon thin film fabricated according to embodiments of the present invention.

FIG. 12 is a graph illustrating dependency on channel direction for threshold voltage of a TFT fabricated using the polycrystalline silicon thin film fabricated using a mask pattern according to embodiments of the present invention illustrated in FIG. 3 and FIG. 9.

Higher electric field mobility and lower threshold voltage characteristics were obtained due to the small number of grain boundaries if primary grain boundaries of the polycrystalline silicon thin film of FIG. 3 were perpendicular to an active channel direction of the TFT. If the active channel direction of the TFT was parallel to the primary grain boundaries, the TFT characteristics were greatly deteriorated, due to the large number of grain boundaries, so that the electric field mobility was reduced by 60% or more, and the threshold voltage was increased by 60% or more.

On the other hand, dependency of the TFT characteristics on the channel direction was greatly deteriorated so that the difference of the TFT characteristics could be controlled within the range of 25% depending on the channel direction in the case of a polycrystalline silicon thin film transistor fabricated using the mask of FIG. 9.

Therefore, the present invention is capable of fabricating a polycrystalline silicon thin film having various shaped grain structures by crystallizing amorphous silicon using a mask in which line shaped patterns are mixed with dot shaped patterns, and fabricating a thin film transistor having superior characteristics without dependency on a channel direction by controlling the microstructure of the polycrystalline silicon thin film through the design of the mask, thereby improving the degree of integration of a circuit part on a panel through the fabricated thin film transistor.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A polycrystalline silicon thin film to be used in display devices, the thin film comprising primary grain boundaries, wherein adjacent ones of the primary grain boundaries are not parallel to each other, wherein an area surrounded by the primary grain boundaries is larger than 1 $\mu m^2$, wherein grains of polycrystalline silicon extend in a plurality of directions in the area from each of the primary grain boundaries, and wherein the area does not contain any substance added to promote crystallization of silicon in the area.

2. The polycrystalline silicon thin film according to claim 1, wherein the primary grain boundaries are formed in a closed curve shape or a closed polygonal shape.

3. The polycrystalline silicon thin film according to claim 1, wherein the primary grain boundaries are formed in a rectangular or a hexagonal shape.

4. The polycrystalline silicon thin film according to claim 1, wherein the primary grain boundaries are symmetrical to each other centering around a certain axis passing through the primary grain boundaries.

5. A thin film transistor fabricated using the polycrystalline silicon thin film according to claim 1.

6. The thin film transistor according to claim 5, wherein the thin film transistor is used in an organic electroluminescent display device.

7. The polycrystalline silicon thin film according to claim 1, wherein the area contains an amorphous silicon portion.

8. The polycrystalline silicon thin film according to claim 7, wherein the grains of polycrystalline silicon extend from the amorphous silicon portion in the area to the primary grain boundaries surrounding the area.

9. The polycrystalline silicon thin film according to claim 1, wherein each of the primary grain boundaries is a boundary where grains of polycrystalline silicon grown in different directions meet.

10. A polycrystalline silicon thin film to be used in display devices, the thin film comprising primary grain boundaries, wherein adjacent ones of the primary grain boundaries are not parallel to each other, wherein an area surrounded by the primary grain boundaries is larger than 1 $\mu m^2$, and wherein polycrystalline silicon grains extend to the primary grain boundaries from an amorphous silicon portion in the area.

11. The polycrystalline silicon thin film according to claim 10, wherein the primary grain boundaries are formed in a closed curve shape or a closed polygonal shape.

12. The polycrystalline silicon thin film according to claim 10, wherein the primary grain boundaries are formed in a rectangular shape or a hexagonal shape.

13. The polycrystalline silicon thin film according to claim 10, wherein the primary grain boundaries are symmetrical to each other centering around a certain axis passing through the primary grain boundaries.

14. A thin film transistor fabricated using the polycrystalline silicon thin film according to claim 10.

15. The thin film transistor according to claim 14, wherein the thin film transistor is used in an organic electroluminescent display device.

16. The polycrystalline silicon thin film according to claim 10, wherein each of the primary grain boundaries is a boundary where polycrystalline silicon grains grown in different directions meet.

* * * * *